United States Patent
Kemmochi et al.

(10) Patent No.: US 7,118,789 B2
(45) Date of Patent: Oct. 10, 2006

(54) SILICA GLASS CRUCIBLE

(75) Inventors: Katsuhiko Kemmochi, Vancouver, WA (US); Robert O. Mosier, Vancouver, WA (US); Paul G. Spencer, Stevenson, WA (US)

(73) Assignee: Heraeus Shin-Etsu America, Camas, WA (US)

( * ) Notice: Subject to any disclaimer, the term of this patent is extended or adjusted under 35 U.S.C. 154(b) by 788 days.

(21) Appl. No.: 09/906,879

(22) Filed: Jul. 16, 2001

(65) Prior Publication Data

US 2003/0012898 A1 Jan. 16, 2003

(51) Int. Cl.
*A47G 19/22* (2006.01)
*B28B 21/00* (2006.01)
*B28B 21/72* (2006.01)
*B28B 23/08* (2006.01)
*B29D 22/00* (2006.01)

(52) U.S. Cl. .................... 428/34.6; 428/34.1; 428/34.4; 428/426; 428/432; 428/433; 428/446; 428/450; 428/457; 117/206; 117/208; 117/220; 117/930; 117/932; 422/245.1; 422/908; 432/262; 432/264

(58) Field of Classification Search ............... 428/34.1, 428/34.4, 34.6, 35.7, 35.8, 35.9, 36.7, 36.91, 428/426, 432, 433, 446, 450, 457; 422/908, 422/245.1; 432/264, 262; 117/73, 206, 208, 117/220, 900, 930, 932
See application file for complete search history.

(56) References Cited

U.S. PATENT DOCUMENTS

| 4,637,571 | A | 1/1987 | Holder et al. ............. 244/3.16 |
| 4,935,046 | A | 6/1990 | Uchikawa et al. |
| 4,956,208 | A | 9/1990 | Uchikawa et al. |
| 5,885,071 | A | * 3/1999 | Watanabe et al. ........... 432/264 |
| 5,976,247 | A | 11/1999 | Hansen et al. |
| 5,980,629 | A | 11/1999 | Hansen et al. |
| 6,319,313 | B1 | 11/2001 | Phillips et al. ............... 117/13 |
| 6,350,312 | B1 | 2/2002 | Phillips et al. ............... 117/13 |
| 6,461,427 | B1 | 10/2002 | Phillips et al. ............... 117/13 |
| 2001/0032580 | A1 | 10/2001 | Phillips et al. ............... 117/13 |
| 2002/0086119 | A1 | 7/2002 | Hariharan et al. .......... 427/453 |
| 2002/0139143 | A1 | 10/2002 | Korus et al. |
| 2003/0211335 | A1 | 11/2003 | McNulty et al. |

FOREIGN PATENT DOCUMENTS

| EP | 0 691 423 A1 | * 10/1996 |
| EP | 0753605 A1 | 1/1997 |
| EP | 0911429 A1 | 4/1999 |
| EP | 1348782 A2 | 10/2003 |
| JP | 1126238 | 5/1989 |
| JP | 6219768 | 8/1994 |
| JP | H8-2932 | * 1/1996 |
| JP | 8040737 | 2/1996 |
| JP | 09-255476 | 9/1997 |
| JP | 2000-247778 | 9/2000 |
| JP | 2000-247778 | * 12/2000 |
| WO | 00/55394 | 9/2000 |
| WO | 00/55395 | 9/2000 |
| WO | 02/40732 | 5/2002 |
| WO | 03008969 A1 | 1/2003 |

* cited by examiner

*Primary Examiner*—Michael C. Miggins
(74) *Attorney, Agent, or Firm*—Marger Johnson & McCollom, PC

(57) ABSTRACT

A silica glass crucible is manufactured by introducing into a rotating crucible mold bulk silica grain to form a bulky wall including a bottom wall and a side wall. After heating the interior of the mold to begin to fuse the bulk silica grains, an inner silica grain, doped with aluminum, is introduced. The heat at least partially melts the inner silica grain, allowing it to fuse to the wall to form an inner layer. The crucible is cooled, the fused silica grains forming nuclei of crystalline silica within the inner layer.

31 Claims, 6 Drawing Sheets

SILICA GLASS CRUCIBLE

BACKGROUND OF THE INVENTION

The present invention is related to the field of silica crucibles, and more specifically to a silica crucible having a multi-layer wall in which one or more of the wall layers are doped with aluminum.

Silicon wafers used in semiconductor industries are made from ingots of single-crystal silicon. Such ingots generally are manufactured by one of two processes: the Czochralski (CZ) process and the floating zone (FZ) process. Among those, the CZ-process is more widely used for mass production of single-crystal ingots.

In the CZ-process, metallic silicon is charged in a silica glass crucible housed within a susceptor located in a crystal growth chamber. The charge is then heated by a heater surrounding the susceptor to melt the charged silicon. The susceptor typically is rotated during this procedure. A single silicon crystal is pulled from the silicon melt at or near the melting temperature of silicon.

For higher ingot productivity, a more rapid CZ-process is desirable. However, accelerating the crystal pulling rate beyond a certain rate results in improper silicon crystal structures. Many trials are done to shorten the "melt down" period by increasing heating power. Similarly, in the production of large-diameter wafers, the amount of silicon charge and the melt-down time are increased and more intense energy is input. The total process time is much longer than that for small-diameter ingots.

This harsh melt-down procedure increases the rate of crucible inner surface roughening. Compressing the melt-down period also negatively affects the rigidity of silica crucible. Silica glass is not hard enough to prevent sagging of the side wall in harsher melt down processes. A more dimensionally stable crucible is desired.

At operating temperatures, the inner surface of a silica crucible reacts with the silicon melt. In many cases, it is the inner layer of the crucible that undergoes a change in morphology. More exactly, the inner surface roughens after prolonged operation in the CZ-process. This roughening can cause a loss of crystal structure of the pulled ingot. Inner surface roughening renders the crucible unfit for use in silicon ingot manufacture.

Additionally, the inner layer of a silica glass crucible can be dissolved into the silicon melt during the CZ-process. Silicon and oxygen, the main components of a silica crucible, are not deleterious to the silicon melt. However, impurities in the inner layer of the crucible can be transferred to the silicon melt during this process. To keep the silicon melt free from such impurities, a crucible is required to be extremely pure or to be insoluble by the silicon melt.

A standard method for making a silica glass crucible is disclosed in U.S. Pat. No. 4,935,046. Quartz grain is supplied in a rotating mold in a crucible shape. The grain is then heated by an electric arc to fuse the inner part of the formed grain, leaving the outside grain unfused. During fusion, additional grain is supplied to the inside surface of the crucible. Quartz grain is melted and piled up as a transparent inner layer, while the formed grain is fused rather promptly to make an translucent silica glass substrate. The resultant crucible has a wall comprising a transparent inner layer and an translucent outer layer having a rough outer surface, which is the interface between fused grain and unfused grain.

One crucible is known to reduce the dissolution of the inner surface of the crucible. U.S. Pat. Nos. 5,976,247 and 5,980,629 disclose the creation of a "devitrified" layer inside of a crucible to prevent particulate generation at the silica-melt interface. The devitrified layer is reported to dissolve uniformly. Here, the devitrified layer means a crystallized silica layer, which the present inventors found to dissolve more slowly in the silicon melt than does amorphous silica. The above references claim alkaline-earth elements as a devitrification promoter, with barium recited as an example.

One of the present inventors filed Japanese Patent 3100836 (laid open Tokukai Hei8-2932), teaching an inner layer containing from 100–2000 ppm aluminum and 0.5–1 mm in thickness. The inner layer crystallizes in the CZ-process, so dissolution is suppressed and the dimensional stability of the crucible is improved.

It is known in the ingot manufacturing industry that circular patterns ("rosettes") are observed on the crucible surface contacting the silicon melt. Examples are shown in U.S. Pat. No. 4,935,046, FIGS. 6A–6B. The ring is referred to in U.S. Pat. No. 4,935,046 as crystobalite. This phenomenon was investigated and determined to be a rosette surrounded by crystobalite.

The crystobalite ring is normally decorated with brown deposit when cooled down after a CZ-process use. It is hypothesized that the brown deposit is either silicon monoxide or colloidal silicon. The center of the rosette has a rough surface that is either not covered by crystobalite or covered by a very thin crystobalite layer. The outside of the rosette is the original silica glass surface, which has retained its original smoothness.

As CZ-process time continues, rosettes grow and the surfaces of the rosette centers become rough. Further, the rosettes merge and the rough surface area is increased. The smooth virgin surface decreases and finally disappears. When a major portion of the inner surface of the crucible is covered by a rough surface, the pulled silicon crystal loses its crystalline structure. Such a roughened crucible is unsuitable for ingot manufacture and silicon crystal pulling using a roughened crucible must be ceased to avoid manufacture of substandard ingots.

A method to reduce roughening of the crucible inner surface is disclosed in U.S. Pat. No. 4,935,046. The reference further mentions that growth of crystobalite is suppressed, as the result of applying the method. By applying the layer-by-layer deposition method as taught by this reference, however, suppression of crystobalite is insufficient and roughening still proceeds to a significant extent. "Devitrification" of the outer layer of a crucible is disclosed in U.S. Pat. Nos. 5,976,247 and 5,980,629. By coating a crucible with barium-containing chemicals, the outside of the crucible is "devitrified", i.e., crystallized, when used in a CZ-process. This crystallized layer reinforces the crucible at operating temperatures and prevents sagging of the crucible side wall.

By using barium as a crystallization promoter, the crystallized layer grows as CZ-process time elapses. The silica glass experiences a large volume change when it crystallizes, creating stress at each of the interfaces of the glassy phase and crystalline phase. This stress is relieved by micro-scale deformation of the crucible. If the crystalline layer thickness exceeds a certain level, the crucible is prone to cracks and possible leakage of the silicon melt. Even if the amount of barium-doped material is carefully optimized to the running conditions, the crucible nevertheless occasionally experiences cracking toward the end of a CZ-process run.

Japanese Patent P2000-247778A discloses a three-layer crucible. The layers are a transparent synthetic silica inner layer, a synthetic silica or natural quartz glass middle layer, and an aluminum-doped silica outer layer. The optimum range for aluminum concentration in the outer layer is reported to be 50–120 ppm. The best mode taught in this reference has an approximately 3 mm thick outer layer doped with aluminum at about 75 ppm.

The doped aluminum outer layer helps to prevent sagging of crucible. However, the inner layer of this crucible is still prone to uncontrolled rosette formation and growth during a CZ-process.

A long-life crucible is therefore desirable, especially a large-diameter CZ-process crucible. Specifically, the side wall of the crucible should be able to maintain its structural integrity without warping, and the inner surface of the wall should resist roughening during a CZ-process.

SUMMARY OF THE INVENTION

Generally, the present invention provides a silica glass crucible comprising a wall, including a bottom wall and a side wall, and an aluminum-doped layer formed on the inner portion of the wall. In a preferred embodiment, an aluminum-doped layer is also formed on an outer portion of the side wall.

The silica glass crucible according to this aspect of the invention is made by introducing into a rotating crucible mold bulk silica grain, consisting essentially of quartz grain, to form a bulky wall including a bottom wall and a side wall. After heating the interior of the mold to fuse the bulk silica grains, an inner silica grain, doped with aluminum, is introduced into the mold. The heat also at least partially melts the inner silica grain, allowing it to fuse to the wall to form an inner layer. The crucible, thus fused, is then cooled. Optionally, the crucible can be held at a high temperature to form a plurality of nuclei of crystalline silica within the inner layer. In the preferred embodiment described above, outer silica grain doped with aluminum is introduced into the rotating mold to form an outer layer prior to introduction of the bulk grain.

Another aspect of the invention is a silica glass crucible having a wall, wherein a layer formed on an inner portion of the wall is non-homogeneously doped with aluminum to promote crystallization of silica. A method for making a silica glass crucible according to this embodiment is similar to that described above, however, the inner silica grain employed to produce this embodiment is a non-homogeneous combination of silica grain containing aluminum. The non-homogeneous combination of silica grain can be a mixture of aluminum-doped and aluminum-free silica grains. Alternatively, aluminum-coated coarse quartz grain can be utilized.

The invention will become more readily apparent from the following Detailed Description, which proceeds with reference to the drawings, in which:

DETAILED DESCRIPTION OF THE PREFERRED EMBODIMENT(S)

Figure 1:
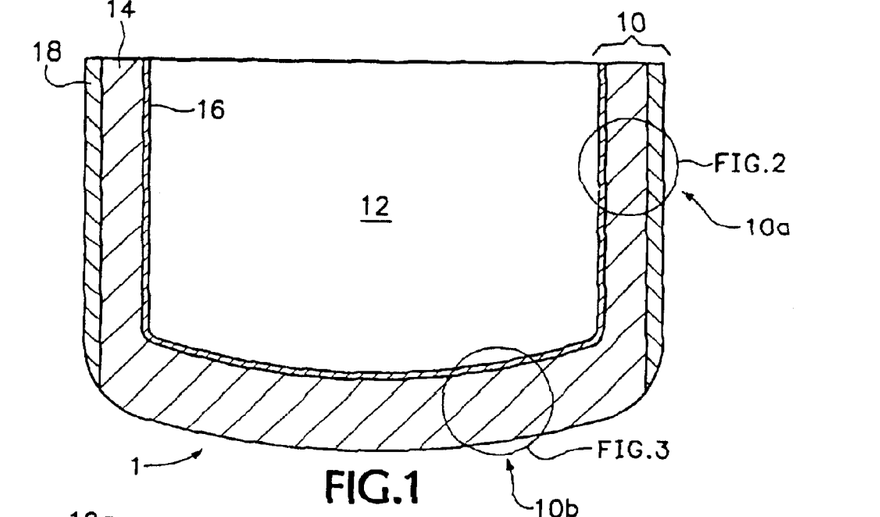
FIG. 1 is a cross-sectional view of one embodiment of a silica glass crucible according to the present invention.

In more detail, one aspect of the present invention provides a silica glass crucible suitable for use in a CZ-process. Turning now to FIG. 1, one aspect of the present invention is a silica glass crucible 1 having a wall 10 defining an interior cavity 12. The wall 10 comprises a side wall 10s (FIG. 2) and a bottom wall 10b (FIG. 3).

The side wall 10s comprises a bulk layer 14 of pure silica. The bulk layer 14 generally is not doped with aluminum. A layer 16 can be formed on the inner portion of the wall 10. The inner layer 16 is comprised of fused silica grain homogeneously doped with aluminum in the range of 50–500 ppm, preferably 80–160 ppm, and most preferably 100–120 ppm.

Figures 2, 3, 4:
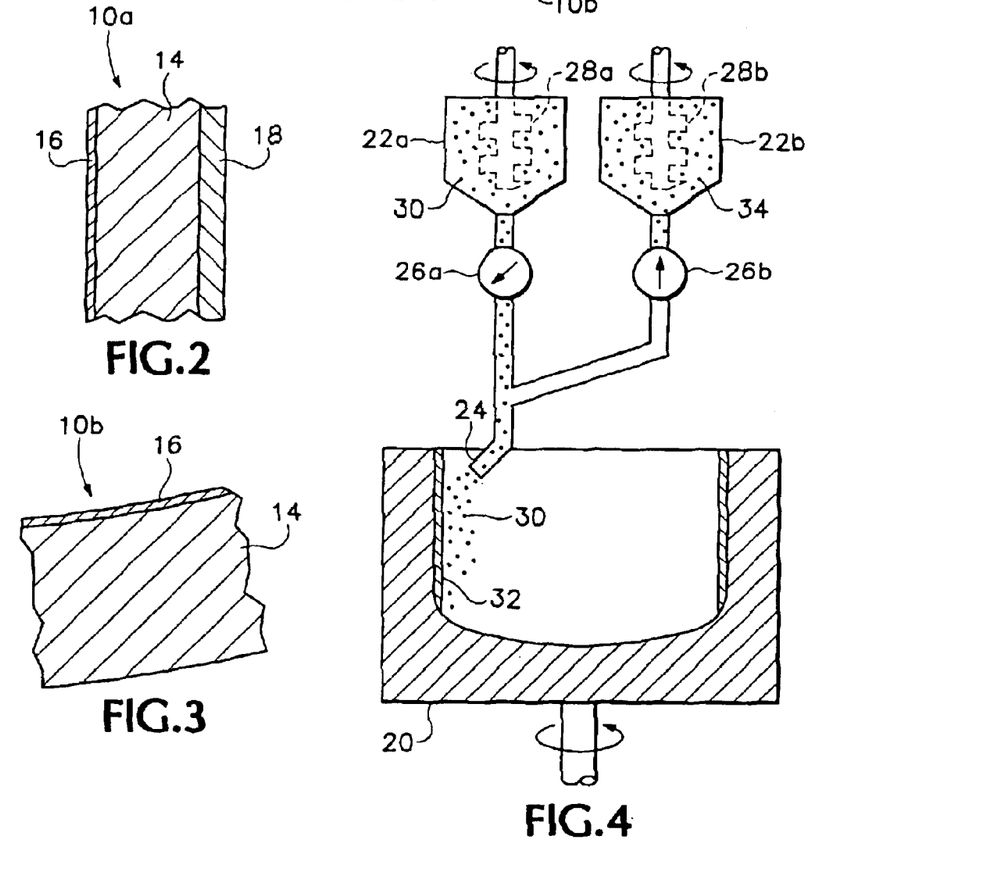
FIG. 2 is an enlarged, partial cross-sectional view of the side portion of the wall of the silica glass crucible shown in FIG. 1.
FIG. 3 is an enlarged, partial cross-sectional view of the bottom portion of the wall of the silica glass crucible shown in FIG. 1.
FIGS. 4–7 are cross-sectional views of methods for making alternative embodiment silica glass crucibles according to the present invention.

In the alternative embodiment of the crucible shown in FIGS. 1–3, an aluminum-doped layer is also formed on the outer portion of the wall 10. The outer layer 18 is approximately 0.5–2.5 mm in thickness and can be doped with aluminum in the range of about 100–500 ppm. In a preferred embodiment, the outer layer 18 is doped with aluminum in the range of about 120–500 ppm.

An enlarged view of a side portion of the wall of the above alternative embodiment is shown in cross-section in FIG. 2. The side wall 10s comprises the bulk layer 14, the inner layer 16 and the outer layer 18. In a representative crucible, the side wall 10s has a thickness of approximately 8.0 mm, of which the inner layer 16 comprises 0.2–1.2 mm, the outer layer 18 comprises 0.5–2.5 mm, and the bulk layer 14 constitutes the remaining 4.3–7.3 mm.

An enlarged view of the bottom wall of the crucible of FIG. 1 is shown in cross-section in FIG. 3. Consistent with the representative example discussed above, the bottom wall 10*b* typically has a total thickness of 10.0 mm, of which approximately 0.2–1.2 mm comprises an inner layer 16. The bottom wall 10*b* of the crucible of this embodiment can alternatively be constructed with an aluminum-doped outer layer (not shown).

Figure 5:
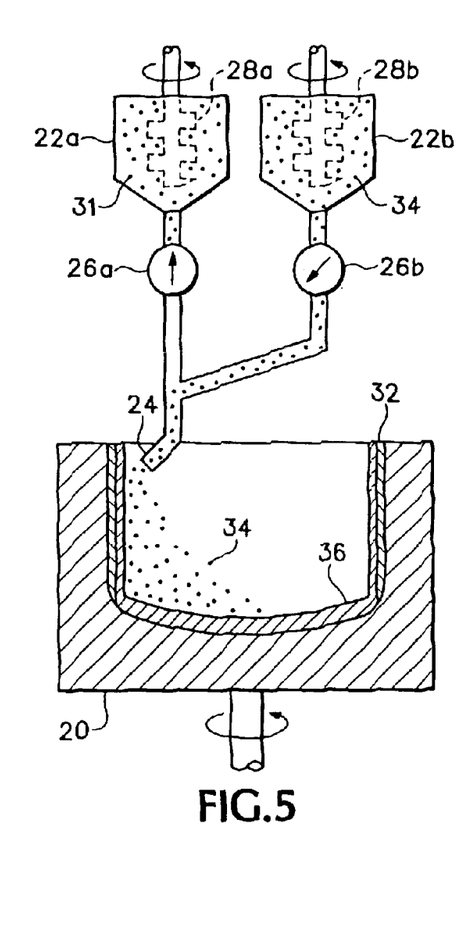
Figure 6:
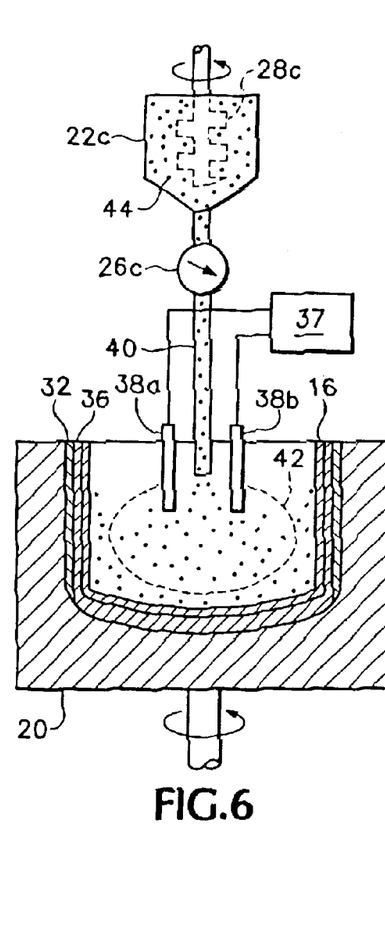

Another aspect of the present invention is a method to make such crucibles. The method shown in FIGS. 4–6 is for making the alternative embodiment of the invention having both an inner layer and an outer layer. The formation of an outer grain layer 32 in the crucible wall 10 need not be performed to produce a crucible having an aluminum-doped inner layer 16 but not a doped outer layer 18. For illustrative convenience, these figures show a grain introduction apparatus having multiple metered grain hoppers.

An outer grain layer of a three-layer crucible is formed in a rotating mold 20, as shown in FIG. 4. An outer grain hopper 22*a* communicates via a feed tube 24 with the interior of the mold 20. The feed tube 24 can employ a valve 26*a* to meter the flow of silica grain 30 from the hopper 22*a* to the interior of the mold 20. Outer silica grain 30 is flowed thereby into the rotating mold 20. Rotation of the crucible mold 20 provides sufficient centrifugal force to retain the poured outer silica grain 30 on the inner side surface of the mold 20 as outer grain layer 32.

To form the bulk grain layer 36, the bulk hopper 22*b*, grain flow meter 26*b* and feed tube 24 are used. In FIG. 5, bulk silica grain 34 is introduced into the mold 20 to form the bulk grain layer 36. The bulk silica grain 34 is preferably pure quartz grain.

When constructing a crucible having an outer layer 18, it is possible to vary or decrease the speed of rotation of the mold 20 to permit the bulk silica grain 34 to be applied to the side and bottom of the mold. Thus, outer silica grain 30 can be deposited on the sides and bottom of the mold 20, to produce a crucible 1 wherein the outer layer 18 comprises both the side wall 10*s* and bottom wall 10*b*.

A spatula (not shown), shaped to conform to the inner surface of the mold, is generally used to shape the introduced outer and/or bulk silica grain. In this manner, the outer grain layer 32 and bulk grain layer 36 each can be formed to a selected thickness.

Fusion of formed silica grain is shown in FIG. 6. An electrode assembly, comprising a power source 36 and electrodes 38*a*,38*b*, is positioned partially within the interior cavity of the rotating mold 20. An electric arc is produced between electrodes 38*a*,38*b* by supplying 250–350V and approximately 1800 A direct current. A region of heat 42 is thereby generated within the mold interior. This heat 42 serves to fuse formed grain layers 30,34 in the mold.

Fusion proceeds through the formed grain from proximal to distal, relative to electrodes 38*a*,38*b*. The mechanism of progressive fusion through the silica grain layer according to this technique is known to those skilled in the art.

After fusion of the surface of the formed bulk grain layer 36, inner silica grain 44 is poured from the inner silica grain hopper 22*c* through feed tube 40; flow regulating valve 26*c* can be utilized similarly to valves 26*a*,26*b*. The rate of inner silica grain 44 deposition is controlled via the introduction rate of inner silica grain 44. An exemplary manufacture according to this method introduces inner silica grain 44 into the mold 20 at 130 grams/minute for three minutes. The arc produced between the electrodes 38*a*,38*b* creates a very strong plasma field, propelling the partially melted inner silica grain 44 outward, enabling it to be deposited on the sides and bottom of the crucible inner surface.

The inner grain 44 passes through the heated region 42, is at least partially melted by the arc flame therein, and is deposited on the surface of the bulk grain layer 36. The inner grain 44 thus deposited is fused to the bulk grain layer 36 to form an inner layer 16. Molten inner grain 44 thereby is continuously deposited and fused over a period of time of inner layer formation. The inner layer 16 thus formed is essentially transparent and bubble-free.

Conversely, the process results in outer layer 18 and bulk layer 14 (FIG. 1), when present by forming the outer grain layer 32 and bulk grain layer 36, respectively, and subsequently fusing them, as described. After fusion, these layers 18,14 typically are translucent and contain numerous tiny bubbles.

Fusion is carried out so that unfused grain is preserved between the mold 20 and fused bulk layer 14 (or outer layer 18, if present) of the side wall 10*s*. Unfused bulk silica grain 34 is left at the bottom 10*b* and side wall 10*s*. Thus, a rough, bubble-containing outermost surface results. For this reason, the thickness of an outer grain layer formed prior to fusion does not control the final depth of an outer layer. Rather, it is the degree to which fusion is carried on that will determine the final outer layer depth.

After formation of the inner layer 16 by the deposition and fusion step discussed above, the crucible is cooled forthwith. A minimum cooling time, e.g. approximately 90 seconds, is necessary before a crucible thus manufactured has sufficient structural rigidity to permit removal from the mold 20 without deformation.

Optionally, the crucible can be held at a selected temperature for a selected period of time, or the crucible can be cooled at a controlled rate. Cooling times, temperatures and effects are discussed with reference to specific examples, below. Final processing can include fine sanding or polishing of the crucible exterior surface, edge cutting, cleaning and packaging to protect the crucible.

The inner layer 16 in the wall 10 of a crucible of the present invention is doped homogeneously with aluminum in the range of about 50–500 ppm, and most preferably between 100–120 ppm. The inner layer 16 should be free of bubbles, as a bubble entrapped within the inner layer 16 may serve as an initiation point of cracking of the layer when crystallized.

Aluminum is chosen as the doping component, because its use permits silica crystallization to be limited to the doped layer of the crucible wall 10. The range of aluminum doping was found to be effective in the crucible of the present invention to provide structural integrity without inducing cracking.

This crystallization is particularly important where the silicon melt contacts the inner surface of the crucible. A crucible made with an homogeneous doping level below about 50 ppm fails to achieve the desired partial silica crystallization of the relevant inner layer 16 during the time period of a typical CZ-process. Conversely, only marginal additional benefit is gained by raising the aluminum doping level in the inner layer 16 above about 500 ppm.

The inner layer 16 in the wall 10 of this crucible further has a depth of about 0.2–1.2 mm, and preferably 0.3–0.7 mm. An experimental crucible having an aluminum-doped inner layer 16 greater than about 1.2 mm deep experiences cracking during a CZ-process. This cracking is believed to be the result of stress at the junctions of the crystalline and glassy silica phases within the wall 10.

The inner layer 16 must possess a threshold depth in order to promote silica crystallization within the layer. A doped inner layer 16 less than about 0.2 mm deep exhibits incomplete silica crystallization when used in an exemplary CZ-process application.

An alternative embodiment of the crucible thus described further comprises an aluminum-doped outer layer 18 in the wall 10. The outer layer 18 of such a crucible is doped with aluminum in the range of about 100–500 ppm, preferably 120–500 ppm. Doping at levels above 500 ppm imparts no further advantage to the crucible of the present invention. Similarly, uniform crystallization of the outer layer 18 is not observed when the outer layer is doped below about 100 ppm.

The outer layer of the bottom wall 10b is preferably not doped. The bottom wall 10b should not sag down, because it is supported by the susceptor. There is normally a small gap between the exterior surface of the bottom of the crucible and the susceptor. This gap is eliminated during silicon melt-down by deformation of the crucible in response to the heat applied to the crucible. Aluminum doping to this bottom wall 10b actually may suppress this conformation process.

The outer layer 18 in the wall 10 of the above crucible has a depth of about 0.5–2.5 mm. An outer layer 18 depth less than about 0.5 mm results in silica crystallization that is not uniform. Cracking is observed at the junction of the bottom wall 10b and side wall 110 in a crucible having a doped outer layer greater than about 2.5 mm deep. The outer layer 18 therefore can be made to greater depths than the inner layer 16 and yet resist cracking. The tolerance of the outer layer as to maximum depth is attributed to the numerous bubbles resident within the outer layer, coupled with the rough outer surface. These microstructures of the outer layer seem to allow a thicker crystallized layer without cracking.

Figure 7:
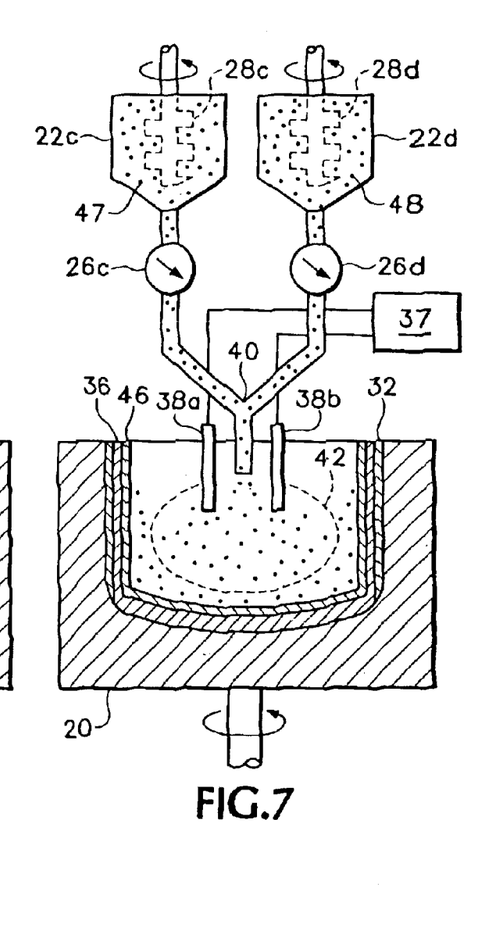

In another alternative embodiment, a crucible inner layer 16 is non-homogeneously doped with aluminum. This crucible is made according to the steps set forth above in FIGS. 4–5. FIG. 7 shows the non-homogeneously aluminum-doped silica grain 47,48 that replaces inner silica grain 44.

As shown in FIG. 7, a two-hopper system can be employed wherein aluminum-doped inner grain 47 is introduced from a hopper 22c and non-doped quartz inner grain 48 is introduced from a second hopper 22d. As an alternative, the mixture of grains 47,48 can be pre-mixed and delivered from a single hopper 22c.

The hoppers can have stirring means 28c,28d to maintain uniformity of the silica grain housed in the hoppers. Metering means 26c,26d can be utilized to regulate the rates of grain introduction in the same fashion as has been previously described.

A representative mixture comprises aluminum-doped silica grain 47, e.g., 160 pmm aluminum-doped, mixed with non-doped silica grain 48. The non-doped silica grain 48 can be natural quartz, which inherently and uniformly is contaminated with aluminum, generally at levels less than about 18 ppm. Alternatively, the present invention can use synthetic silica grain, typically containing less than 1 ppm aluminum. The two grains 47,48 are preferably combined at an approximately 1:1 ratio to maximize the non-homogeneity of the mixture, although other doping levels and ratios are efficacious.

Non-homogeneous doping of aluminum is in the range of about 30–100 ppm as an average aluminum concentration in an inner layer 16, and preferably less than 80 ppm on average. The method of mixing, or blending, aluminum-doped silica grain and non-doped silica grain is preferable for producing a crucible with an inner layer 16 doped with aluminum in the range of 30–80 ppm. Synthetic silica grain can be used in place of pure (non-doped) natural silica grain to produce an inner layer 16 having an average doping level of less than about 50 ppm.

In this embodiment of the invention, mixing of aluminum-doped grain 47 and pure silica grain 48 can be done as a separate process prior to the mixture's introduction in crucible manufacture. In this case, the pre-mixed grain 47,48 is placed in one hopper and can be introduced using a metering valve, similar to the method shown in FIG. 6.

In an alternative embodiment of this aspect of the invention, non-homogeneously aluminum-doped inner silica grain can be comprised of aluminum-coated coarse silica grain. Employment of coated coarse silica grain is preferable where the desired inner layer doping level is in the range of 80–100 ppm as an inner layer 16 average aluminum concentration.

To be denominated "coarse grain", the grain preferably contains silica grains of sizes larger than and smaller than 200 μm. At least one-fifth of the grains in the coarse grain described herein should have a size greater than 200 μm. In a preferred embodiment, approximately half of the grains in the coarse grain are larger than 200 μm.

Aluminum coating can be accomplished by any means creating aluminum-containing film on the silica grain. The preferable film is a layer of aluminum oxide or alumina. One method of achieving an aluminum film is to wet the silica grain with aqueous aluminum nitrate solution ($Al(NO_3)_3$·$9H_2O$), then tumble dry in a rotary kiln. Other inorganic or organic aluminum compounds can be employed in place of aluminum nitrate, e.g., $Al(OH)_3$, $AlCl_3$, or $Al(HCO_2)_3$.

Figure 8:
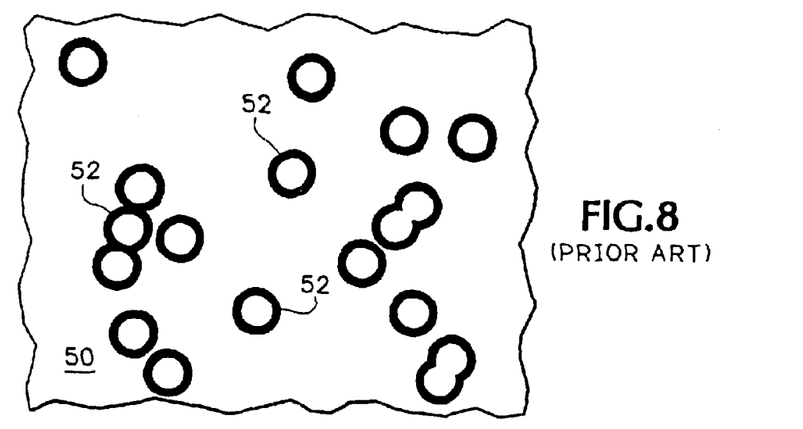
FIGS. 8–10 are partial plan views of an inner surface of a silica glass crucible of the prior art, showing silica crystallization rosettes occurring during a CZ-process.
Figure 9:
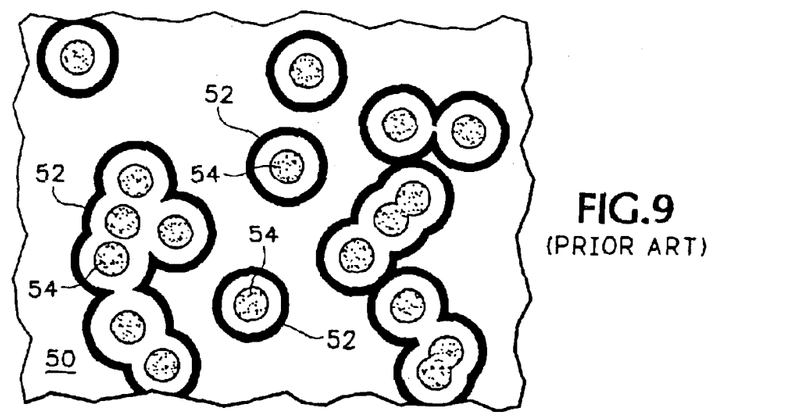
Figure 10:
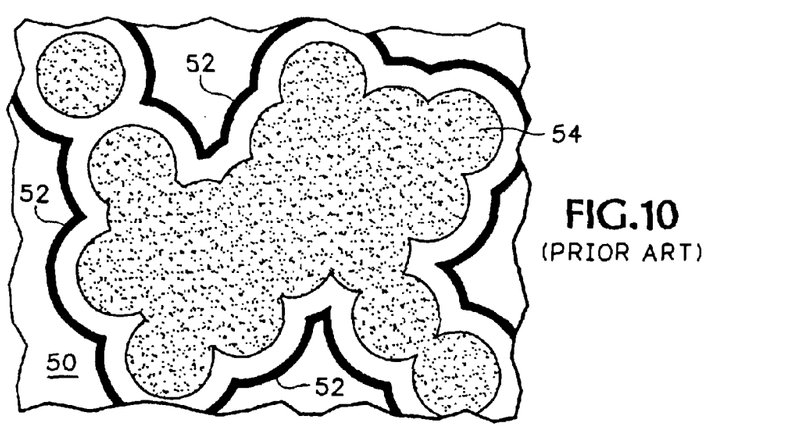

As discussed earlier, rosettes form on the inner surface of a crucible during a CZ-process (FIGS. 8–10). FIG. 8 depicts an inner surface 50 of a crucible, on which have formed a plurality of rosettes where the crucible surface 50 contacts the silicon melt. A rosette generally has a ring 52; the ring and the region inside the ring are crystobalite 56.

During a CZ-process, the rosettes grow in area, spreading to cover an increasing percentage of the inner layer surface 50, as shown in FIG. 9. As the rosette grows, a rough texture 54 appears in the center. The rough surface area 54 within the boundaries of the rosettes also expands across the crucible inner surface. FIG. 10 shows the state of an exemplary crucible inner surface 50 of the prior art later in the CZ-process. Rosettes merge and the rough surface area 54 is increased. As discussed above, inner surface roughening adversely impacts the crystalline structure of the growing silicon ingot.

Figure 11:
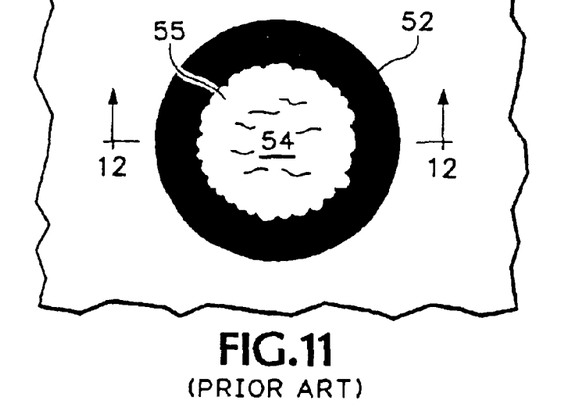
FIG. 11 is a partial, enlarged top view of the prior art crucible wall shown in FIG. 8, illustrating the structure of a silica crystallization rosette.
Figure 12:
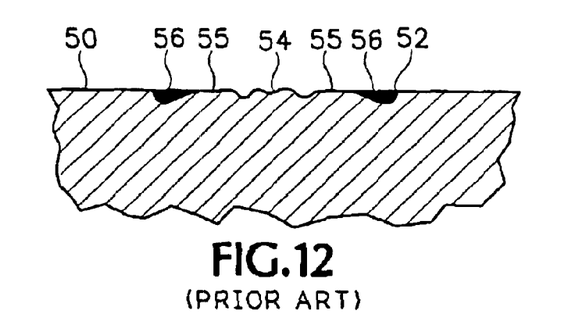
FIG. 12 is a cross-sectional view of the prior art crucible inner surface and silica crystallization rosette depicted in FIG. 11.

Enlarged top and cross-sectional views of a rosette of the prior art are shown in FIGS. 11–12. The center of the rosette has a rough surface texture 54 surrounded by crystobalite (crystalline silica) 56, the latter of which is seen to extend partway into the crucible wall 10 from the inner surface 50. The crystobalite ring 52 is decorated with brown materials and normally is observed as a brown ring on the inner surface of a used crucible. In some rosettes of the prior art, a small smooth surface boundary 55 exists between the rough area 54 and the inner edge of the ring 52.

Figure 20:
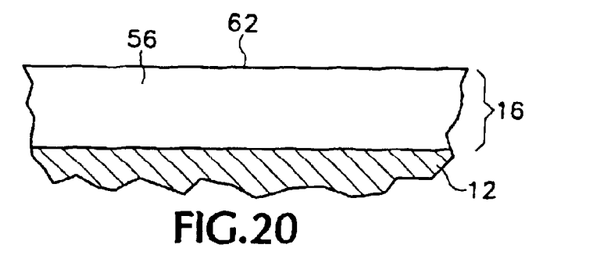
FIG. 20 is an enlarged, partial cross-sectional view of the wall of the silica glass crucible shown in FIG. 1 in an embodiment wherein the crucible was held at high temperature to promote crystallization of silica within the inner surface.

Regarding these rosettes and concomitant surface roughening, the present invention employs aluminum doping to provide three modes for lengthening the useful life of a crucible suitable for use in a CZ-process. First, generation of rosettes can be suppressed by crystallizing the inner surface of a crucible wall (FIG. 20) prior to silicon charge melt-down in a CZ-process. This is accomplished by controlling the cooling step of the method of the present invention. A crucible cooled down rather slowly in the mold, or held at sufficient temperature, resists rosette formation via this mode.

In this mode, the inner surface of the crucible is covered with crystobalite before melt-down of the charged silicon. Rosettes are not formed by a reaction between the silicon melt and crystalline silica. Because a rosette is not generated, a rough surface area does not appear and the inner surface remains smooth.

Some silicon ingot manufacturers perform multiple silicon crystal "pulls" during a single CZ-process. In these uses, a portion of the crucible side wall is alternately covered by the melt, exposed to atmosphere as the melt level drops, then covered again as silicon charge is added to begin another ingot pull. The inner surface of a crucible thus used is subjected to high stress for a longer time period, making more important the inner surface textural integrity.

The fully crystallized mode is difficult to produce if the aluminum is doped uniformly throughout the inner layer 16. By non-homogeneously doping, a fully crystallized inner layer 16 can be formed readily with average doping levels below 100 ppm. Also, the depth of the doping within the inner layer 16 has a direct effect on the rapidity of crystallization in the layer. Therefore, the depth of aluminum doping in the inner layer 16 is important to achieve a fully crystallized inner layer during crucible manufacture.

Figure 13:
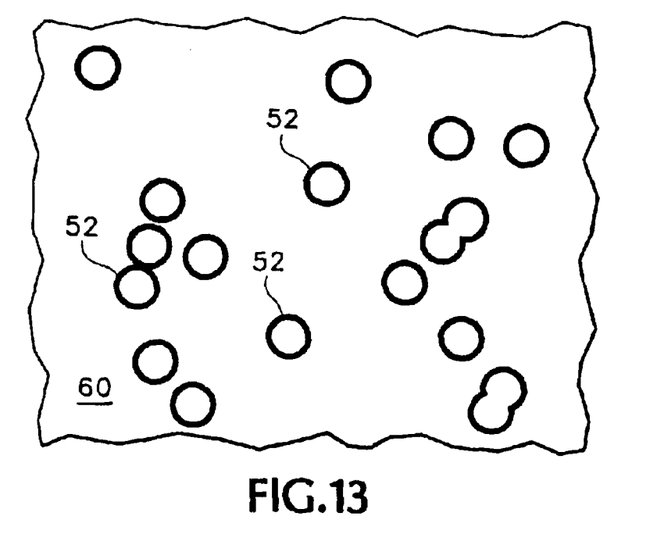
FIGS. 13–15 are partial plan views of an inner surface of a silica glass crucible according to one embodiment of the present invention, showing silica crystallization occurring during a CZ-process.
Figure 14:
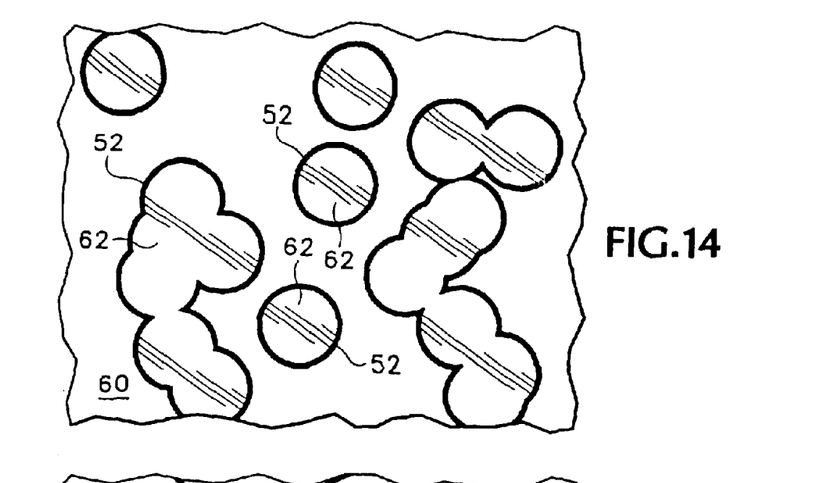
Figure 15:
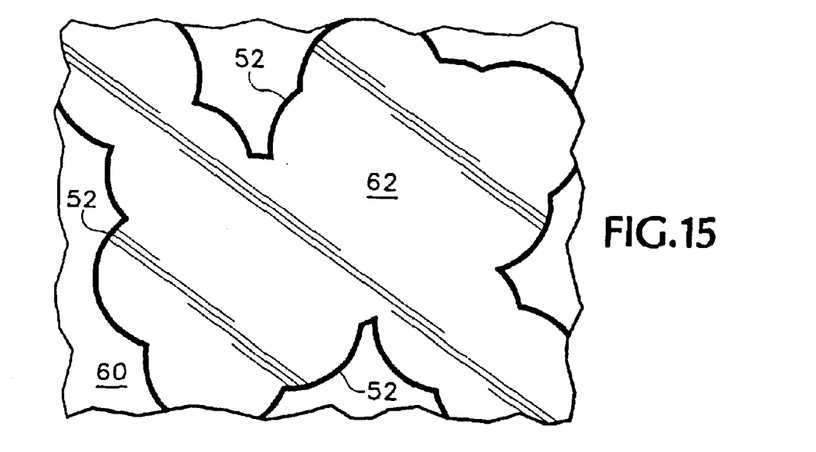

A second mode of maintaining crucible usefulness is to prevent generation of the rough area 54 in the growing rosette. Rosettes initially form as on the inner surface of a crucible according to the present invention (FIG. 13) similarly to those formed on walls of prior art a crucible (FIG. 8). In the present invention crucible, the inner surface of the rosettes that form on the inner surface 60 retain a smooth texture 62. Rosettes continue to grow and merge as occurs on prior art crucible inner surfaces 50, but the smooth surface 62 persists on the inner surface 60 of the present invention crucible (FIGS. 14–15).

Figure 16:
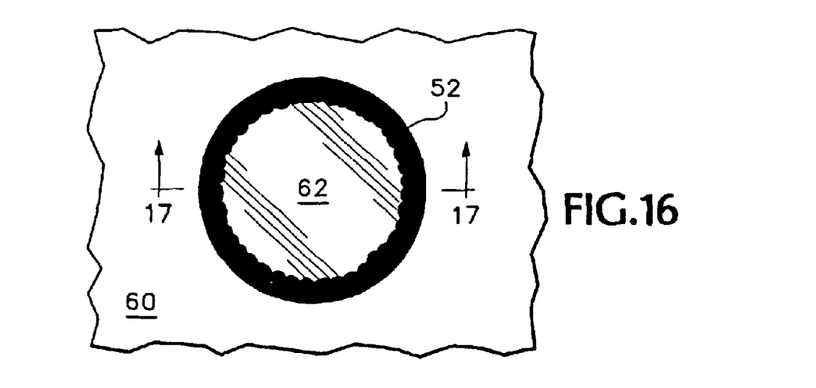
FIG. 16 is a partial, enlarged top view of present invention crucible inner surface shown in FIG. 13, illustrating the structure of a silica crystallization rosette.
Figure 17:
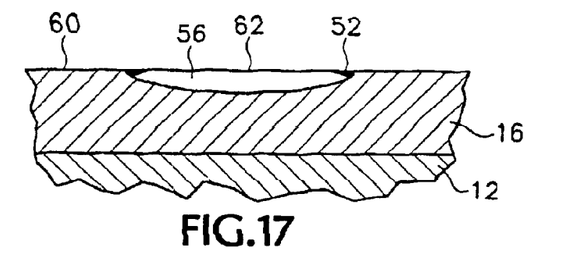
FIG. 17 is a cross-sectional view of the crucible wall and silica crystallization rosette depicted in FIG. 16.

FIGS. 16–17 show a plan view and an enlarged cross-sectional view of a rosette growing on the inner surface 62 of the present invention crucible operating in this mode. This rosette comprises a ring 52 at the outer boundary of the rosette, within which is found crystobalite 56. The crystobalite 56 extends into the inner layer 16 of the crucible wall 10. In contrast to the crucible inner surface 50 of the prior art, the present invention retains a smooth surface 62 within the ring 52 and rosette.

Figure 18:
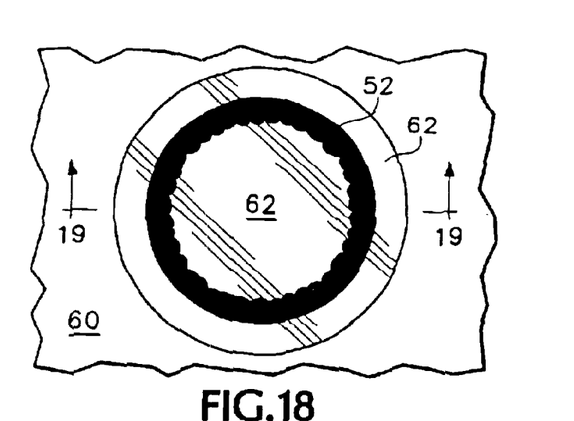
FIG. 18 is a partial, enlarged top view of a present invention crucible inner surface, showing an alternative silica crystallization rosette wherein the crystallization front is proceeding ahead of the ring.
Figure 19:
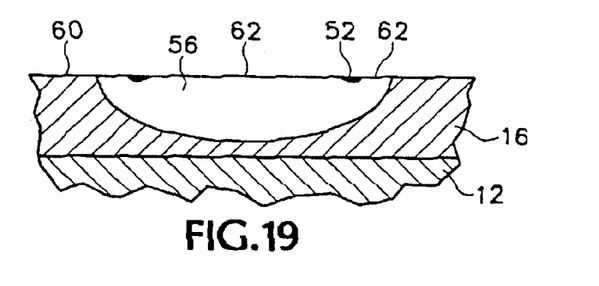
FIG. 19 is a cross-sectional view of the crucible wall and alternative silica crystallization rosette depicted in FIG. 18.

The third mode of maintaining a smooth crucible inner surface is to stifle growth of the rosettes 52, as shown in FIGS. 18–19. The ring 52 of a rosette is crystobalite, which may act as a nucleation site to grow crystalline silica 56 in the silica glass of the inner layer 16. In the example rosette shown in FIGS. 18–19, a corona of crystobalite grows faster than growth of the crystobalite ring 52, such that the ring 52 is surrounded by crystalline silica 56. When the ring 52 is bounded by crystalline silica 56, it is observed that the growth rate of the rosette is decreased by at least 50%.

The original inner surface 60 remains smooth glass. This surface 60 does not degrade as rapidly as in the prior art (FIGS. 9–10). The combination of a large smooth surface 60 and slow-growing smooth crystobalite surface 56 work to maintain a smooth crucible inner surface during a prolonged CZ-process.

The present invention permits selection among these three modes to suit the particular application desired. The rate of crystobalite growth is fastest in the first mode, then the third, and lastly the second. More rapid crystobalite formation and growth is achieved by slower cooling in crucible production compared to traditional cooling. Higher aluminum doping levels enhance the crystobalite growth rate, as does a thinner inner layer. Faster crystobalite growth results with non-homogeneous doping, and especially with non-homogeneous doping using a mixture comprising synthetic silica grain rather than coated coarse silica grain.

Crucible design should preferably be tuned to the conditions of the contemplated CZ-process, and specifically to the heating schedule. An application desirous of a pre-crystallized inner surface (mode 1) would be production of silicon crystals for use in solar cells. Such manufacture typically involves a fast, harsh melt-down of the silicon charge, providing little time for the inner surface to crystallize. Conversely, manufacture of highest-quality ingots for semiconductor use generally employs a slower melt-down and longer processing time. A crucible operating in mode 3 is best suited to this process.

By using aluminum as a crystallization promoter, the thickness of the crystallization in the layer is controlled. Only the region doped with aluminum crystallizes; regions not doped with aluminum do not crystallize during a typical CZ-process operation. This characteristic gives a crucible designer greater freedom to tailor the crucible to the needs of the process in which it will be employed.

The three modes of inner surface smoothness preservation are difficult to achieve if the inner layer doping is uniform and the amount of homogeneous doping is lower than about 50 ppm. Employment of non-homogeneous aluminum doping enables control of silica crystallization in the inner layer and the use of lower aluminum doping levels. A combination of a lesser doping amount, e.g. less than about 100 ppm, and distributing the aluminum doping non-homogeneously throughout the inner layer 16 provides the greatest benefit, especially when non-homogeneous doping is performed by blending with synthetic silica grain. The lifetime of a crucible made in accordance with the present invention thereby is improved.

EXAMPLES

Four crucibles A, B, C and D of the present invention were manufactured to similar dimensions. As well, crucible P was constructed according to the prior art. The nominal diameter of each crucible was 22 inches.

The inner layer 16 of Crucible A was made using non-homogeneously aluminum-doped inner silica grain mixture. Doped inner silica grain 47, doped to a level of 105 ppm, was mixed with pure inner silica grain 48, having a natural aluminum content of about 8 ppm. The two inner silica grains 47,48 were mixed in a ratio of 54:46, yielding an average aluminum content in the inner layer 16 of 60 ppm.

Crucible B likewise was made with a non-homogeneously doped inner layer 16. The mixture used to construct the inner layer 16 of this crucible was 105 ppm aluminum-doped inner silica grain 47 and pure synthetic silica grain 48, the latter containing less than 0.5 ppm aluminum. The doped and pure inner silica grains 47,48 were mixed in a 1:2 ratio, resulting in an average aluminum content of 35 ppm for this mixture.

The non-homogeneously aluminum-doped inner layer 16 of Crucible C was manufactured using aluminum-coated coarse natural silica grain. The average aluminum content of this inner grain was 85 ppm and 42% of the grains were larger than 200 μm in size.

Crucibles A–C were made according to the above-disclosed method for making a crucible having a non-homogeneously aluminum-doped inner layer 16. The three crucibles were cooled in the mold 20 for five minutes before removal and final processing.

The prior art crucible, Crucible P is of 22-inch diameter. The method of manufacture used pure natural silica grain instead of aluminum-doped inner silica grain. This natural silica grain contained roughly 8 ppm aluminum.

Crucibles A–C and P were used in a 120-hour CZ-process, i.e., 120 hours at the chosen high temperature after melting of the silicon substrate. The results of these processes are shown in TABLE 2. Rosettes 52 were seen in the inner surface 62 and in the inner layer 16 of Crucible A. These rosettes had not spread so as to cover a high percentage of the inner surface 62 of Crucible A. Therefore, this exemplary crucible preserved the smoothness of the inner surface 62 by inhibiting the spread of silica crystallization.

The rosettes seen on the inner surface 62 of Crucibles A and C were surrounded by crystobalite, both lateral to and medial to the rosette ring (FIGS. 18–19). The inner surface 62 inside the rosettes also had retained its smoothness.

Crucible B was similarly used in a 120-hour CZ-process. Rosettes formed in the inner layer 16 and had spread and merged so as to cover the majority of the inner surface 62. While little of the original surface remained, the inner surface 62 inside the rosettes nevertheless possessed a smooth surface. The silicon crystal ingot being pulled during the CZ-process was not compromised by the formation and spread of the rosettes in the inner layer 16 of this embodiment.

A fourth crucible was prepared according to the method of the present invention. Crucible D was made similarly to Crucible C, except that Crucible D was held at 1400–1600° C. for one minute, and thereafter permitted to cool in the same manner as the crucibles discussed above, i.e., cooled for approximately five minutes.

Crucible D was subjected to a 120-hour CZ-process, after which the inner layer 16 was examined. The inner surface 62 was found to consist essentially of crystalline silica, with no rosette pattern evident.

The prior art Crucible P was used in a similar 120-hour CZ-process. However, at about 80 hours into the process, the nascent silicon ingot incurred a grain boundary flaw that disrupted its crystal structure. This flaw forced termination of the CZ-process and rendered the silicon crystal unsuitable for its intended use.

Examination of the inner surface of Crucible P revealed that it was nearly totally covered with rosettes, with very little of the virgin glassy surface remaining. The surface within the rosette rings was of a rough texture and likely was the cause of the silicon crystal interference.

The crucible of the present invention provides improved dimensional stability. The inner layer also decreases dissolution of the silica glass into a silicon melt. Further, the inner layer of a crucible according to the present invention resists roughening during a CZ-process.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and sub-combinations of the various elements, features, functions and/or properties disclosed herein.

The invention claimed is:

1. A crucible comprising:
   a crucible wall including a bottom wall and side wall;
   an aluminum-doped inner layer formed on an inner portion of said crucible wall, said inner layer having a thickness in the range of 0.2 mm to less than 0.5 mm; and
   an aluminum-doped outer layer formed on an outer portion of said crucible wall.

2. The crucible of claim 1, wherein the aluminum-doped outer layer is substantially an outer layer of the side wall.

3. The crucible of claim 1, wherein the inner layer is doped with aluminum in the range of about 50–500 ppm.

4. The crucible of claim 1, wherein the outer layer is no more than substantially 0.5–2.5 mm deep.

5. The crucible of claim 1, wherein the outer layer is doped with aluminum in the range of about 100–500 ppm.

6. The crucible of claim 1, wherein a portion of the side wall interposed between the outer layer and the inner layer is free of aluminum doping.

7. The crucible of claim 1, wherein a portion of the bottom wall interposed between the outer layer and the inner layer is free of aluminum doping.

8. A silica glass crucible, comprising:
   a crucible wall including a bottom wall and a side wall;
   an interior cavity defined by said crucible wall; and
   an inner layer formed on the innermost portion of said crucible wall;
   wherein said inner layer has a depth in the range of from 0.2 mm to less than 0.5 mm and is homogeneously doped with aluminum in the range of about 50–500 ppm.

9. The crucible of claim 8, wherein the inner layer is doped with aluminum in the range of about 80–160 ppm.

10. The crucible of claim 8, wherein the inner layer is doped with aluminum in the range of about 100–120 ppm.

11. A silica glass crucible comprising:
    a crucible wall including a bottom wall and a side wall; and
    an inner layer non-homogeneously doped with aluminum,
    said inner layer is disposed on an inner portion of said said crucible wall and having a thickness of at least 0.2 mm,
    said inner layer doped with aluminum in a non-uniform distribution of silica, and
    wherein said inner layer has an average aluminum doping of 30–100 ppm.

12. The crucible of claim 11, wherein the inner layer has a a depth in the range of greater than 0.2 mm to 1.5 mm.

13. The crucible of claim 11, wherein the inner layer has a thickness of substantially 0.3–0.7 mm.

14. The crucible of claim 11, further comprising:
    an aluminum-doped outer layer formed on an outer portion of said crucible wall.

15. The crucible of claim 11, wherein the aluminum-doped outer layer is substantially an outer layer of the side wall.

16. The crucible of claim 11, wherein the outer layer is no more than substantially 0.5–2.5 mm deep.

17. The crucible of claim 11, wherein the outer layer is doped with aluminum in the range of about 100–500 ppm.

18. The crucible of claim 11 wherein a portion of the side wall interposed between the outer layer and the inner layer is free of aluminum doping.

19. The crucible of claim 11 wherein a portion of the bottom wall interposed between the outer layer and the inner layer is free of aluminum doping.

20. A crucible, comprising:

a crucible wall including a bottom wall and side wall;

an aluminum-doped inner layer on an inner portion of said crucible wall; and an aluminum-doped outer layer on an outer portion of said crucible wall;

wherein the inner layer is in the range of 0.2 mm to less than 0.5 mm deep and doped with aluminum in the range of about 50–500 ppm.

21. The crucible of claim 20, wherein the aluminum-doped outer layer is substantially an outer layer of the side wall.

22. The crucible of claim 20, wherein the outer layer is no more than substantially 0.5–2.5 mm deep.

23. The crucible of claim 20, wherein the outer layer is doped with aluminum in the range of about 100–500 ppm.

24. The crucible of claim 20, wherein a portion of the side wall interposed between the outer layer and the inner layer is free of aluminum doping.

25. The crucible of claim 20, wherein a portion of the bottom wall interposed between the outer layer and the inner layer is free of aluminum doping.

26. A method for preparing a silicon melt for pulling a single crystal by the Czochralski method, comprising:

loading silicon charge into a crucible including:
a crucible wall including a bottom wall and a side wall,
an interior cavity defined by said crucible wall, and
an inner layer formed on the innermost portion of said crucible wall, wherein said inner layer has a depth in the range of 0.2mm to less than 0.5mm and is homogeneously doped with aluminum in the range of about 50–500ppm; and melting the polycrystalline silicon within the crucible to substantially devitrify a portion of inner layer which is in contact with the molten silicon.

27. The method of claim 26 wherein said layer is homogeneously doped with aluminum.

28. The method of claim 26 wherein said layer is non-homogeneously doped with aluminum.

29. A method for preparing a molten silicon mass for pulling a single crystal by the Czochralski method, comprising:

heating a silicon charge in a crucible to form the molten silicon mass, the crucible including:

a crucible wall including a bottom wall and side wall, an aluminum-doped inner layer formed on an inner portion of said crucible wall, and an aluminum-doped outer layer formed on an outer portion of said crucible wall, wherein the inner layer is in the range of 0.2mm to less than 0.5mm deep and doped with aluminum in the range of about 50–500ppm.

forming a devitrified shell of β-cristobalite on the inner and outer layers of the side wall of the crucible when the charge of polysilicon is heated to form the molten silicon mass.

30. The method of claim 29 wherein said layer is homogeneously doped with aluminum.

31. A method for preparing a silicon melt for pulling a single crystal by the Czochralski method, comprising:

loading silicon charge into a crucible including:
a crucible wall including a bottom wall and a side wall,
an inner layer non-homogeneously doped with aluminum,
said inner layer disposed on an inner portion of said crucible wall and having a thickness of at least 0.2mm, and
said inner layer doped with aluminum in a non-uniform distribution,
wherein said inner layer has an average aluminum doping of 30–100 ppm; and melting the polycrystalline silicon within the crucible and substantially converting at least a portion of inner layer which is in contact with the molten silicon from an amorphous glass structure to a β- cristobalite crystalline structure.

* * * * *

UNITED STATES PATENT AND TRADEMARK OFFICE
CERTIFICATE OF CORRECTION

| | |
|---|---|
| PATENT NO. | : 7,118,789 B2 |
| APPLICATION NO. | : 09/906879 |
| DATED | : October 10, 2006 |
| INVENTOR(S) | : Kemmochi et al. |

It is certified that error appears in the above-identified patent and that said Letters Patent is hereby corrected as shown below:

At column 12, line 48, please replace "said said crucible" with --said crucible--

At column 12, line 55, please replace "a a depth" with --a depth--

At column 13, line 9, please replace "layer on" with --layer formed on--

At column 13, line 11, please replace "layer on" with --layer formed on--

Signed and Sealed this

Twenty-third Day of December, 2008

JON W. DUDAS
*Director of the United States Patent and Trademark Office*